(12) United States Patent
Sterling (10) Patent No.: US 9,582,470 B2
(45) Date of Patent: Feb. 28, 2017

(54) ANTENNA APPARATUS AND SOFTWARE FOR EMULATING SAME

(71) Applicant: Christopher Sterling, Oklahoma City, OK (US)

(72) Inventor: Christopher Sterling, Oklahoma City, OK (US)

(*) Notice: Subject to any disclaimer, the term of this patent is extended or adjusted under 35 U.S.C. 154(b) by 0 days.

(21) Appl. No.: 14/788,964

(22) Filed: Jul. 1, 2015

(65) Prior Publication Data

US 2015/0303558 A1 Oct. 22, 2015

Related U.S. Application Data

(63) Continuation-in-part of application No. 14/591,019, filed on Jan. 7, 2015.

(60) Provisional application No. 61/925,808, filed on Jan. 10, 2014.

(51) Int. Cl.

| | |
|---|---|
| *H01Q 1/38* | (2006.01) |
| *G06F 17/10* | (2006.01) |
| *H01Q 21/00* | (2006.01) |
| *G06F 17/50* | (2006.01) |
| *G06T 11/60* | (2006.01) |
| *H01Q 1/36* | (2006.01) |
| *H01Q 21/06* | (2006.01) |

(52) U.S. Cl.
CPC .............. *G06F 17/10* (2013.01); *G06F 17/50* (2013.01); *G06T 11/60* (2013.01); *H01Q 1/36* (2013.01); *H01Q 21/00* (2013.01); *H01Q 21/06* (2013.01)

(58) Field of Classification Search
CPC . G06T 11/60; H01Q 1/38; H01Q 9/27; H01Q 21/061

USPC ......................................................... 343/893
See application file for complete search history.

(56) References Cited

U.S. PATENT DOCUMENTS

| 3,925,784 A | * 12/1975 | Phelan ................. H01Q 3/2647 342/374 |
| 5,327,143 A | 7/1994 | Goetz et al. |
| 6,525,697 B1 | 2/2003 | Theobold |

(Continued)

OTHER PUBLICATIONS

Azadegan, "Highly Miniaturized Antennas and Filters for Wireless Applications", 2004, The University of Michigan, entire document.*

(Continued)

*Primary Examiner* — Dameon E Levi
*Assistant Examiner* — David Lotter
(74) *Attorney, Agent, or Firm* — Fellers, Snider, Blankenship, Bailey & Tippens, P.C.; Terry L. Watt (57) ABSTRACT

According to an embodiment, there is provided a plurality of spiral antenna elements that are generated using algorithms taught herein that can be implemented in hardware or software. Embodiments utilize symmetric combinations of 2 or 3 such spiral elements on a substrate or within computer memory to create an array. Each of the antenna elements is in the form of expanding spiral (non-logarithmically expanding) and contains at least six turns. Among the suitable spirals are Fermat, and/or Cornu (Euler) and/or Archimedes and/or other non-logarithmically expanding spirals in any combination. As an article of manufacture, the antenna array may be incorporated into a chip, such as might be found in a cell phone or other CPU based product, or printed or otherwise mounted on an article of clothing, for example.

4 Claims, 10 Drawing Sheets

(56) References Cited

U.S. PATENT DOCUMENTS

| | | | |
|---|---|---|---|
| 7,652,626 B1* | 1/2010 | Potenziani, II | G01S 3/04 342/439 |
| 2003/0142035 A1 | 7/2003 | Goldstein | |
| 2008/0048136 A1* | 2/2008 | Dandurand | A61N 2/06 250/515.1 |
| 2008/0114540 A1 | 5/2008 | Nagel | |
| 2008/0284673 A1 | 11/2008 | Delgado et al. | |
| 2009/0051620 A1* | 2/2009 | Ishibashi | H01Q 1/243 343/897 |
| 2011/0050520 A1* | 3/2011 | Reavis | H01Q 1/273 343/718 |
| 2014/0300526 A1 | 10/2014 | Rahman et al. | |

OTHER PUBLICATIONS

PCT/US2015/038564/International Search Report and Written Opinion.

\* cited by examiner

*Figure 10A*
Blood Test: Subject #X

*Figure 10B*
Blood Test: Subject #Y

*Figure 10C*
Blood Test: Subject #Z

ANTENNA APPARATUS AND SOFTWARE FOR EMULATING SAME

CROSS REFERENCE TO RELATED APPLICATION

This application is a continuation-in-part of co-pending U.S. Ser. No. 14/591,019, filed Jan. 7, 2015 and also claims the benefit of provisional patent application Ser. No. 61/925,808 filed Jan. 10, 2014, herein incorporated by reference in its entirety for all purposes.

FIELD OF THE INVENTION

This invention relates to antennas and, in particular, to arrays of radiating and receiving spiral elements used in combination with other components and articles of manufacture using the same.

BACKGROUND

Electromagnetic field (EMF) radiation (sometimes called radio frequency radiation) of the sort emitted by a wide variety of modern electronic components has been associated with numerous types of health problems in humans (e.g., inflammation, decreased oxygenation, reduced stamina and endurance, agitated nervous system, muscle tension, spasms, cramping, headaches and migraine pains, or decreased digestive function, etc.). With respect to low intensity EMF radiation, it is now broadly acknowledged that even low intensity EMF radiation interacts with environmental and biological variables which raises immediate concerns that there might be unforeseen negative biological consequences of such exposure. As a consequence, there has been an increasing research focus in recent years aimed toward understanding the effects of short and long term exposure to such radiation might have on the individuals who are exposed to it. Whatever its impact, there is mounting evidence that EMF radiation has a measurable impact on the human body and other organisms.

Heretofore, as is well known in the EMF radiation arts there has been a need for an invention to address and solve the disadvantages of prior art methods of attenuating same. Accordingly it should now be recognized, as was recognized by the present inventors, that there exists, and has existed for some time, a very real need for a system and method that would address and solve the above-described problems.

Before proceeding to a description of the present invention, however, it should be noted and remembered that the description of the invention which follows, together with the accompanying drawings, should not be construed as limiting the invention to the examples (or preferred embodiments) shown and described. This is so because those skilled in the art to which the invention pertains will be able to devise other forms of the invention within the ambit of the appended claims.

SUMMARY OF THE INVENTION

According to a first aspect, there is provided herein an antenna apparatus. In an embodiment, some number of antenna elements in the form of some number of Archimedes spirals will be arranged in symmetric combinations of two or three (or more) such spirals to form the conductive portion of an antenna apparatus. In other embodiments, the Archimedes antenna elements will be combined with a plurality of Fermat's (double) spiral elements to form the conductive portion of the antenna apparatus. The spirals will be then placed on an appropriate substrate for use as an antenna and situated spatially as described hereinafter. In each case, the spirals will be comprised of at least three or more turns, but preferably 6 turns.

In another embodiment, some number of Archimedes spirals will be combined with a plurality of Cornu (double end Euler or "S") spirals to form the conductive portion of an antenna apparatus, with the conductive portion being placed on an appropriate substrate. In other embodiments, the Cornu antenna elements will be used alone in symmetric combinations of two or three such spirals to form the conductive portion of an antenna apparatus. In each case, the spirals will be comprised of at least three turns, but preferably six.

In a further embodiment, some number of Fermat and/or Cornu spirals will be used in combination to form the conductive portion of the antenna apparatus, with the spirals so used being placed on an appropriate non-conducting substrate according to the placement described hereinafter. In each case, the spirals will be comprised of three or more turns, but preferably six.

Finally, according to an embodiment an antenna element will be formed from a spiral that expands non-logarithmically. In each case, the spirals will be comprised of at least three, but preferably six, turns.

According to still another aspect, there is provided a software program and associated algorithms for producing in software a simulated array substantially similar to one or more of those physical arrays disclosed herein as hardware. In the text that follows, it should be understood that when "hardware" patterns are described the same patterns are intended to be used in this embodiment of the as being displayed on a video screen or otherwise calculated and stored in video or other memory. In each case, the spirals will be comprised of at least three turns, but preferably six turns.

In a further embodiment, an antenna array is simulated using algorithms set forth herein. As discussed below, some number N of non-logarithmic spirals of the sort described below (preferably where N=1 or N=2x or N=3x, x being a positive integer) will be placed in a spaced apart location on a substrate or simulated within a computer that preferable has a display integral thereto. As an article of manufacture, the antenna array disclosed herein may be incorporated into any electronic or electrical device. As a method, it may be implemented within any programmable device.

According to another embodiment there is provided an antenna array comprising: a substrate; and, three or more conductive spiral array elements symmetrically arrayed and present on said substrate, each of said three or more array elements having a form defined by an equation in the coordinates x and y:

$$x = + \int_0^A \cos\left(\frac{\pi}{2}s^2\right)ds$$

$$y = - \int_0^A \sin\left(\frac{\pi}{2}s^2\right)ds$$

where, A is a length of the curve as measured from the origin, and where A is chosen such that each of said three or more array elements has at least six turns, where s is a parameter of integration measured in radians, π is a constant which is approximately equal to 3.14, and, wherein a number of said three or more array elements is a multiple of either two or three.

According to a further embodiment antenna array comprising: a substrate; and, three or more conductive spiral array elements symmetrically arrayed and present on said substrate, each of said three or more array elements having a form defined by an equation in the polar coordinates as $$r=a\theta,$$

where r is a distance from an origin and θ is an angle of rotation chosen such that each of said spiral array elements has at least six turns, and a is an arbitrary constant, and, wherein a number of said three or more array elements is a multiple of either 2 or three.

According to another embodiment, there is provided an antenna array comprising: a substrate; and, three or more conductive spiral array elements symmetrically arrayed and present on said substrate, each of said three or more array elements having a form defined by an equation in the polar coordinates as $$r=a\theta,$$

where r is a distance from an origin and θ is an angle of rotation chosen such that each of said spiral array elements has at least six turns, and a is an arbitrary constant, and, wherein a number of said three or more array elements is a multiple of either two or three.

In a further embodiment, there is provided an antenna array comprising: a substrate; and, three or more conductive spiral array elements symmetrically arrayed and present on said substrate, each of said three or more array elements having a form defined by the equation in the polar coordinates as $$r^2=a^2\theta,$$

where r is a distance from an origin and θ is an angle of rotation chosen such that each of said spiral array elements has at least six turns, and a is an arbitrary constant, and, wherein a number of said three or more array elements is a multiple of either two or three.

In still a further embodiment, there is provided a method of attenuating low intensity EMF radiation in a computing device having a display integral thereto, comprising the steps of: within said computing device, forming a graphical representation of a symmetric antenna array comprised of at least three non-logarithmically expanding spirals, wherein each of said spirals has at least six turns,
wherein each of said three or more has at least six turns, and wherein a number of said three or more array elements is a multiple of either two or three; and, displaying said graphical representation on said display.

According to still another embodiment, there is provided a device for reducing DNA damage from low intensity EMF radiation to an individual who is using said electronic device, wherein said electronic device has a display integral thereto, comprising: a CPU in electronic communication with said display; computer memory in electronic communication with said CPU, said computer memory containing instructions executable by said CPU, said instructions comprising the steps of: forming a graphical representation of a symmetric antenna array comprised of at least three non-logarithmically expanding spirals, wherein each of said three or more spirals has at least six turns, and wherein a number of said three or more spirals is a multiple of either two or three; and, displaying said graphical representation on said display.

The foregoing has outlined in broad terms the more important features of the invention disclosed herein so that the detailed description that follows may be more clearly understood, and so that the contribution of the instant inventors to the art may be better appreciated. The instant invention is not limited in its application to the details of the construction and to the arrangements of the components set forth in the following description or illustrated in the drawings. Rather the invention is capable of other embodiments and of being practiced and carried out in various other ways not specifically enumerated herein. Additionally, the disclosure that follows is intended to apply to all alternatives, modifications and equivalents as may be included within the spirit and the scope of the invention as defined by the appended claims. Further, it should be understood that the phraseology and terminology employed herein are for the purpose of description and should not be regarded as limiting, unless the specification specifically so limits the invention.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION

While this invention is susceptible of embodiment in many different forms, there is shown in the drawings, and will herein be described hereinafter in detail, some specific embodiments of the instant invention. It should be understood, however, that the present disclosure is to be considered an exemplification of the principles of the invention and is not intended to limit the invention to the specific embodiments or algorithms so described.

Turning now to the various figures herein, it should be noted as an initial matter that, although the various hardware configurations are discussed in figures attached hereto, the focus of the instant invention is reproduction of the patterns as set out below as antenna elements and/or on the screen of any computer device having such, and/or writing to computer volatile or nonvolatile memory the patterns described hereinafter. In each case, the instant inventor believes such would have the same or a comparable effect as preparing one of the hardware embodiments below.

By way of general explanation to the discussion that follows, the photon is the elementary particle responsible for electromagnetic phenomena. It is the carrier of electromagnetic radiation of all wavelengths, including gamma rays, x-rays, ultraviolet light, visible light, infrared light, microwave, and radio waves. The photon differs though from many other elementary particles such as the electron and the quark, in that it has zero rest mass, therefore, it travels in a vacuum at the speed of light. Like all quanta, the photon has a wave, spin, and particle properties. They also have the ability to carry the "frequency" and "intensity" from the last source they were associated with. So the photon can carry the antenna array through a device to keep the person's/or aerobic organism's electromagnetic biofield coherent within the wavelength distances of the electronic or electrical devise the array is applied to.

Figure 5:
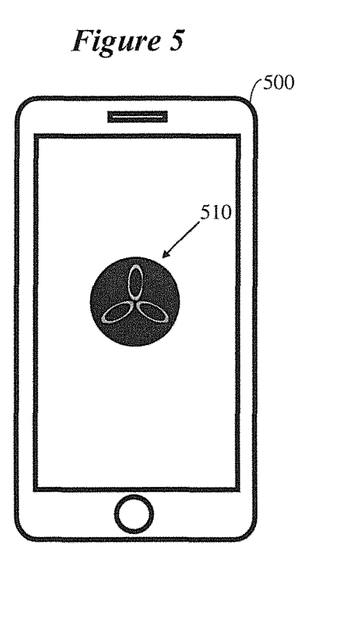
FIG. 5 contains a schematic illustration of a cell phone with an embodiment of the invention active thereon.
Figure 13:
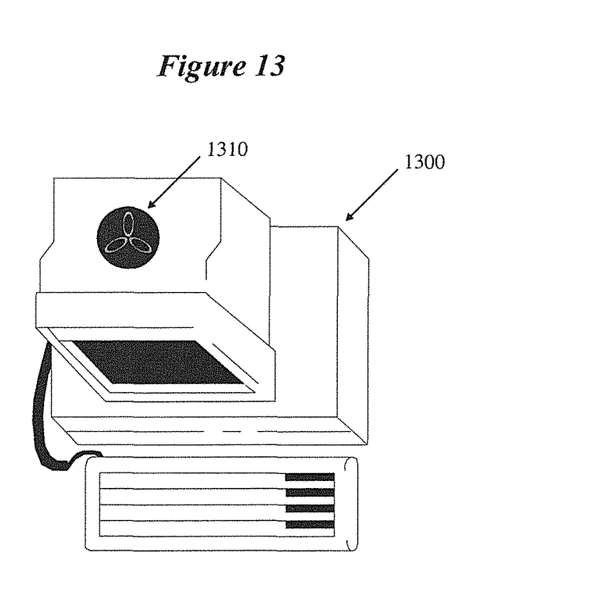
FIG. 13 contains a schematic illustration of an embodiment of an array of elements according to the instant invention as it might be used in practice on a desktop computer.

Turning now to a discussion of certain embodiments of the invention, referring initially to FIG. 5, the icon 510 contained there will be interpreted throughout the instant disclosure as any combination of the spirals 14, 200, 210, 300, 325, 350, or other non-logarithmically expanding spirals that are configured as an antenna element according to the rules discussed below. Said another way, this icon 500 should be broadly interpreted to represent combinations of the embodiments of FIGS. 1, 2 and 3. In some embodiments, the icon 500 will be used to represent the entirety of the patterns such as those set out in FIGS. 6-8 (i.e., array elements that are positioned according to the configurations 600, 700, and 800). FIG. 5 contains a schematic drawing of the icon 510 as it might appear when used in conjunction with a cellular telephone 500. FIG. 13 contains an example of a desktop computer 1300 that has been outfitted with an antenna 1310 that has been created according to rules discussed below.

Figure 17:
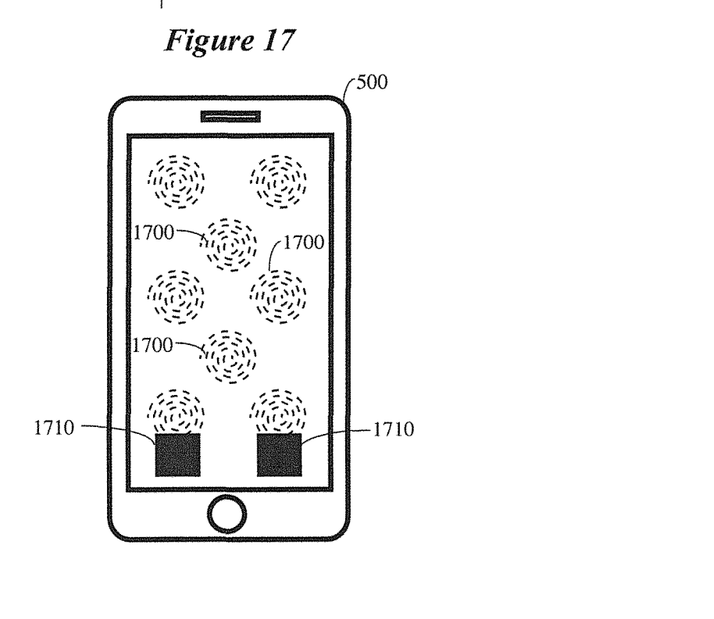
FIG. 17 contains an exemplary embodiment of the invention.

Turning next to FIG. 17, there is provided in this figure an example of how the instant invention might be implemented in practice. According to this embodiment, a computer program will be written that displays some number of array elements 1700 on a cellular telephone screen 500 according to the invention as generally discussed previously. In some variations, the array elements 1700 might be written to the foreground (i.e., the currently displayed) screen, thereby obscuring all other running programs, icons 1710, etc. In other cases, as is shown in FIG. 17, the array elements 1700 might be written to the background so that icons 1710, windows, etc., would be visible on top of the array elements 1700. In some cases the array elements 1700 will be written in very low intensity (e.g., relatively high transparency) so that they could be written on top of whatever is currently displayed on the screen without interfering with what appears there. This variation is generally indicated by the use of dashed lines in FIG. 17. This writing might be static (e.g., the chosen pattern would be written one time as a nearly transparent overlay) or periodically adjusted as the display changes (e.g., as the user manipulates windows on the screen or as other programs change what is viewable, e.g., as a video is played). However, an embodiment that generally works well is to create an image that is completely transparent except where the array elements are drawn and then make the array elements themselves almost completely transparent, e.g., with transparency set to "1" on a scale of 0 to 100, with "0" corresponding to completely transparent and not viewable.

In some embodiments, the image that is currently being displayed on the screen will be read and an overlay designed that is as unobtrusive as possible. For example, if the current screen display is entirely white, a pattern that is slightly off white might be used. If the screen is completely black, a dark grey pattern could be used. In cases where there are a plurality of different colors displayed, one embodiment would determine on a pixel-by-pixel basis a best shade of color to use so as to be as unobtrusive as possible. Of course, those of ordinary skill will understand how this might be done.

Figure 1:
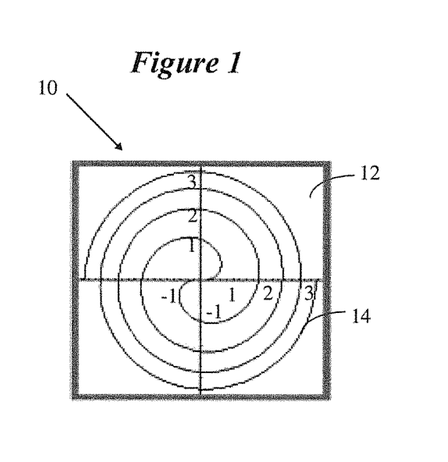
FIG. 1 is a top plan view of one embodiment of a hardware component of an antenna element.

Next turning FIG. 1, therein is depicted an antenna array that is schematically illustrated and generally designated as element 10. The antenna array 10 includes a substrate 12 having an antenna element 14 disposed thereon, which comprises a substantially continuous transducer arranged as an outwardly non-logarithmically expanding spiral of the sort defined below. It is important, though, that the array element of this embodiment has at least three turns, but preferably six turns therein. The spiral may be oriented in either direction (clockwise or counter clockwise).

In one embodiment, the outwardly expanding generally spiral antenna element shape can be represented as a Fermat's Spiral which may be written (in polar coordinates) as:

$$r^2 = a^2 \theta,$$

where r is a distance from the origin, θ is an angle of rotation, and a is an arbitrary constant. In some embodiments six turns of the spiral will be used, i.e., $0 \leq \theta \leq 2160°$ (e.g., FIG. 1). Other embodiments might use a different number of turns greater than 3, but 6 is the preferred number.

Figure 2:
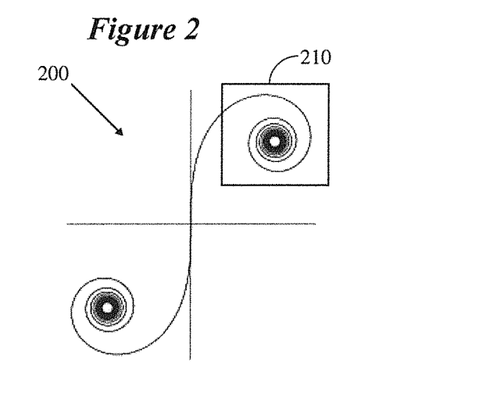
FIG. 2 is a plan view of an antenna element suitable for use with the instant invention.
Figure 3:
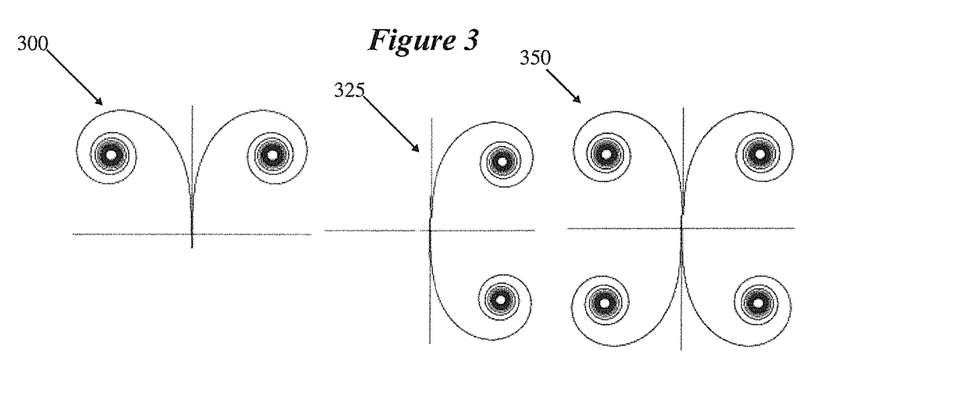
FIG. 3 contains various embodiments of antenna elements suitable for use with the instant invention.

According to another embodiment, a double-ended spiral of Cornu (also known as the clothoid or Euler's spiral) might be used (FIG. 2 and various of the variations of FIG. 2 in FIG. 3). One set of defining equations for such a curve is:

$$x = + \int_0^A \cos\left(\frac{\pi}{2} s^2\right) ds$$

-continued $$y = -\int_0^A \sin\left(\frac{\pi}{2}s^2\right)ds,$$

where A is the length of the curve as measured from the origin. This curve has the property that its curvature grows with the distance from the origin. In an embodiment, "A" will be chosen such that the resulting figure has at least 3 turns on each end, but preferably 6. Note also that, in some embodiments, only a portion of this equation might be used, e.g., the portion of the spiral contained within box 210. It should be noted and remembered, that one of ordinary skill in the art will recognize that constant values might be multiplied by each of the forgoing to scale such to the particular array that is being constructed.

Note that the embodiment of FIG. 2 may be modified in any number of ways. FIG. 3 contains some specific examples. Obviously, the number of different curves that might appear (2, 3, 4, etc.) is a design decision that might be varied according to the particular circumstances.

Figure 4:
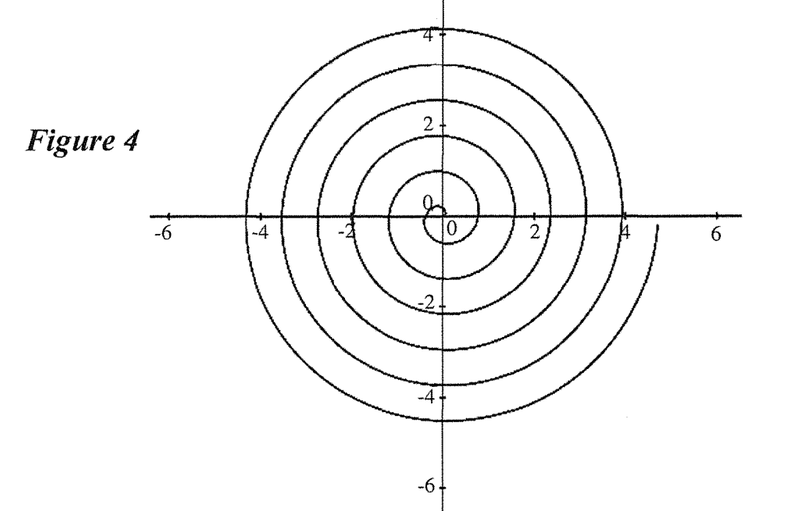
FIG. 4 contains a schematic representation of a version of an Archimedes spiral which could be an antenna element according to the instant invention.

According to another embodiment, there is provided another array element as set out schematically in FIG. 4. FIG. 4 contains a representation of an Archimedes spiral antenna element 410 as it would appear when written in polar coordinates. Conventionally, this antenna element is represented by the equation r=aθ, where a is an arbitrary constant.

According to some embodiments the curve/array element might be expressed in three dimensions. More particularly, it should be appreciated that the arrays discussed herein might not be expressed in a plane but, instead, might be three dimensional shapes, e.g., r=azθ, where the variable "z" corresponds to a vertical/orthogonal direction with respect to the (r, θ) plane. This is just one example of how a 3D version might be created from the various 2D representations included herein. Of course, higher multidimensional shapes could certainly be designed by those of ordinary skill in the art according to the equations and other rules/constraints presented herein. Those of ordinary skill in the art will readily be able to devise other approaches to arranging the array elements.

In some embodiments, there may be multiple array elements 500 clustered in various combinations of two or three such elements. FIGS. 6-8 and 12 illustrate plan views of some embodiments of this sort. Note that the spirals used in these particular examples are generic in the sense that it is anticipated that in some embodiments various ones of those presented in FIGS. 1 through 3 inclusive should be substituted for those in the illustration. For example, with respect to FIG. 6, the spirals 610 of that figure are intended to be generally representative of any combination of the nonlogarithmically expanding spirals discussed previously. It is not required that every one of the spirals 610 be the same size or take the same functional form. Thus, for purposes of the instant disclosure when a spiral of the general form 610 appears in a figure it should be understood that it is a just "placeholder".

Figure 6:
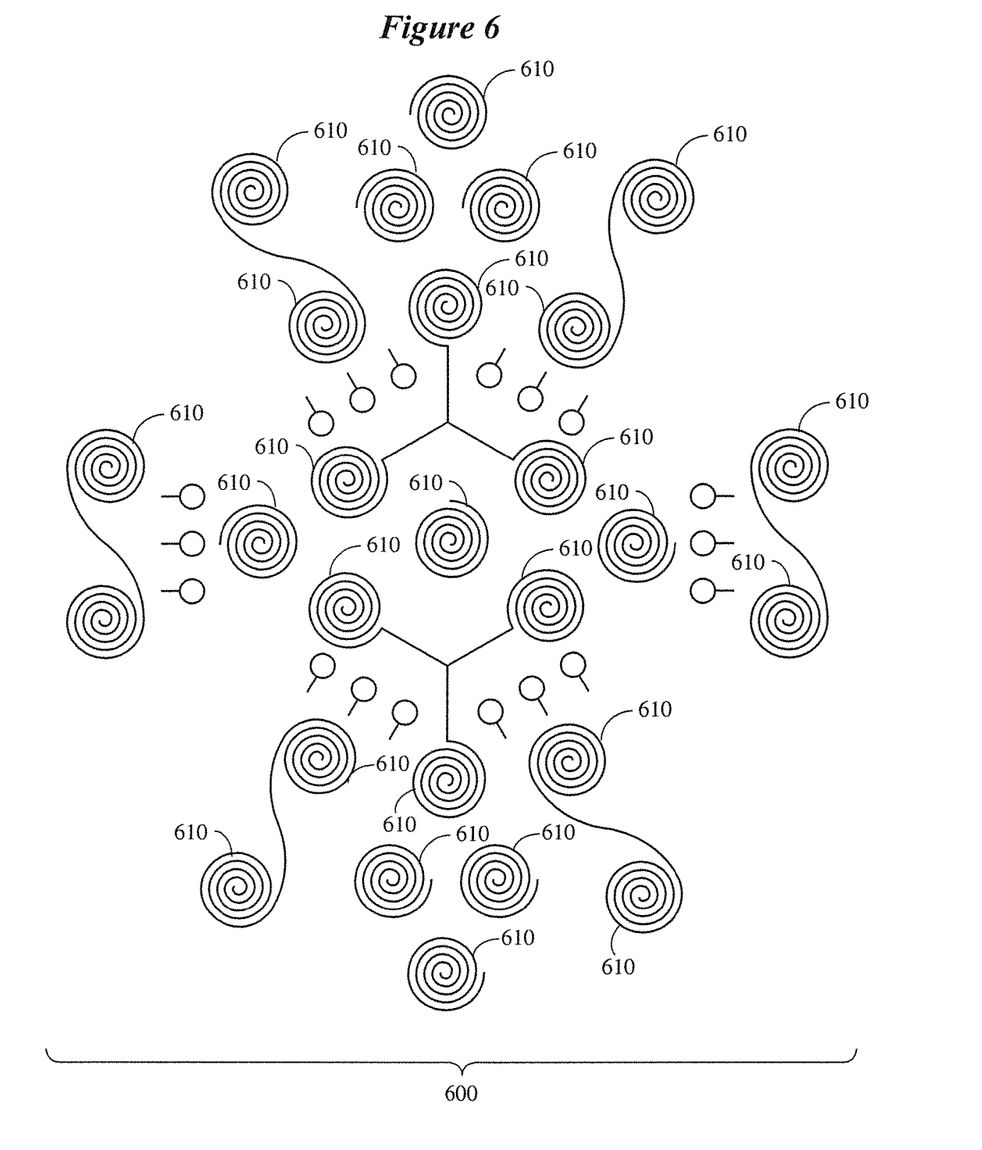
FIG. 6 contains an embodiment of a collection of antenna elements arranged as an array according to the teachings herein.
Figure 7:
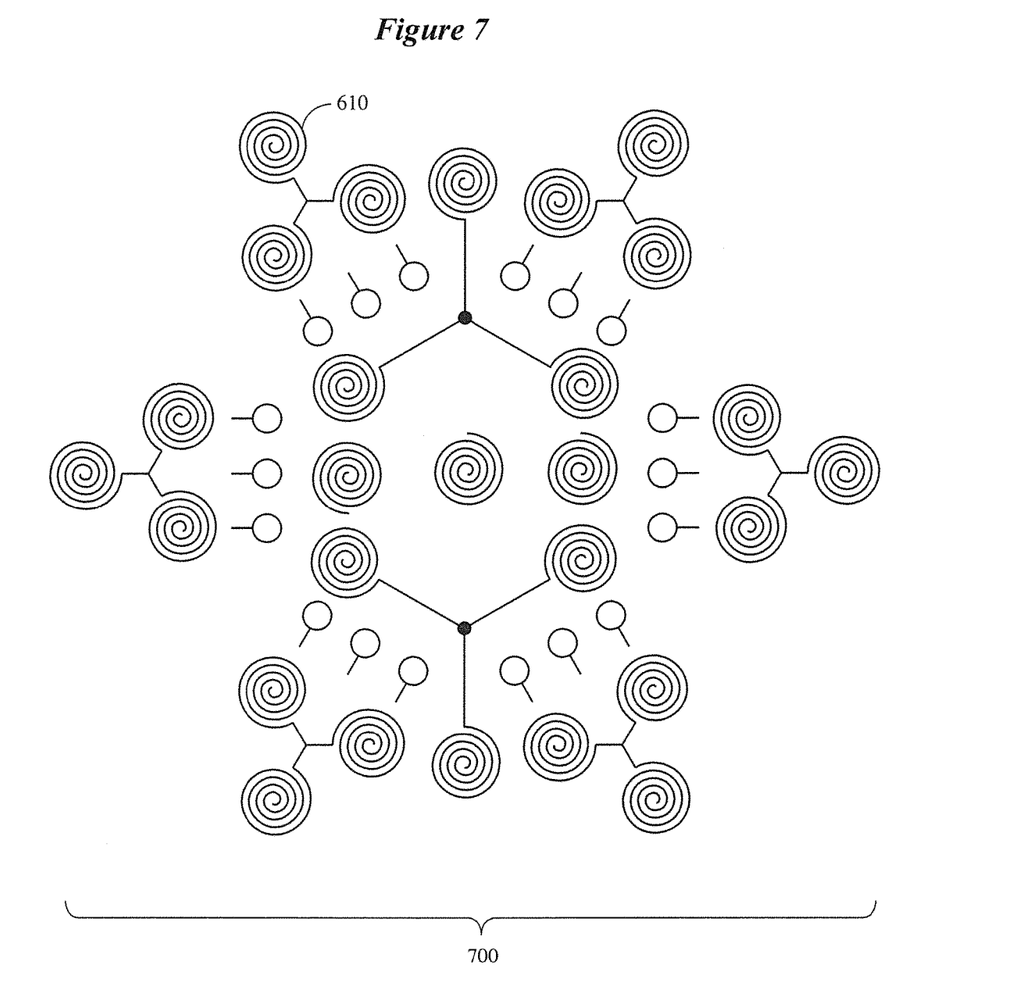
FIG. 7 contains an embodiment of a collection of antenna elements arranged as an array according to the teachings herein.
Figure 8:
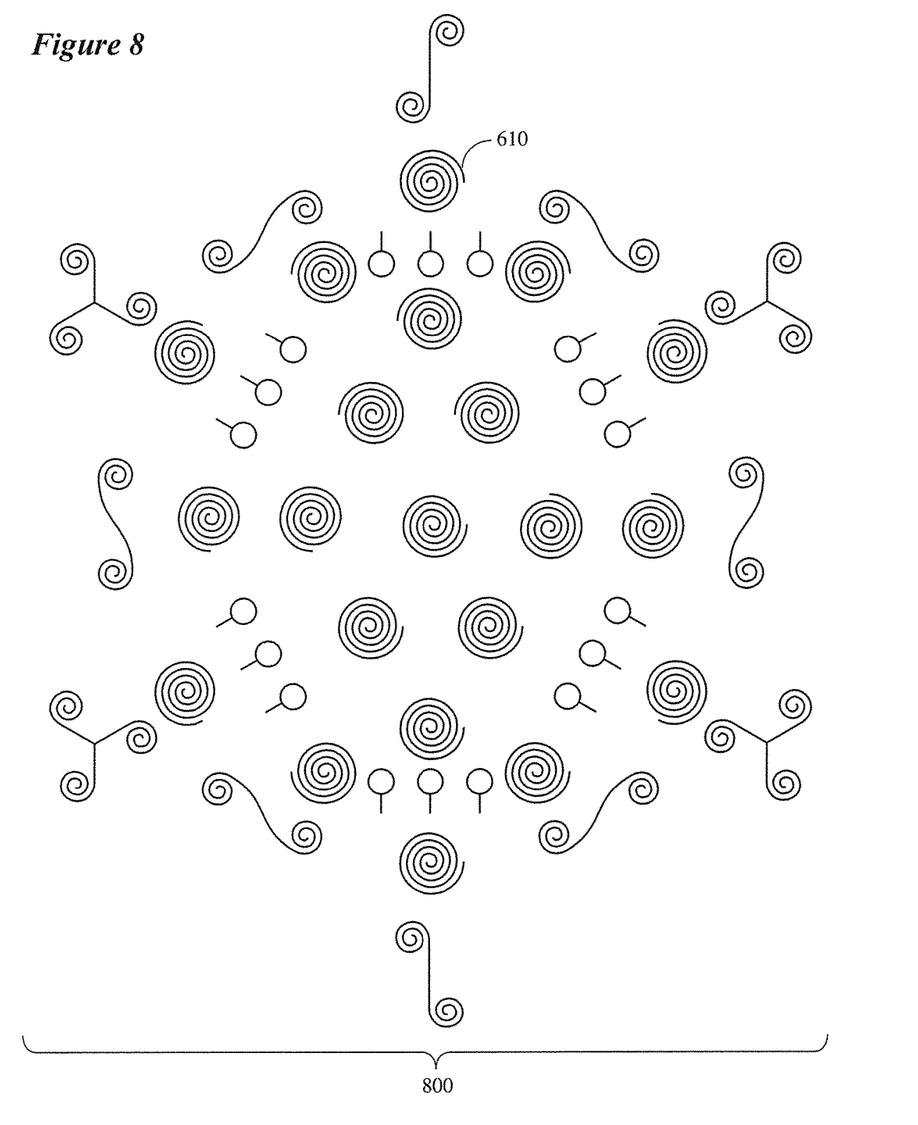
FIG. 8 contains an embodiment of a collection of antenna elements arranged as an array according to the teachings herein.

Further with respect to FIGS. 6-8, as can be seen, the some number of the antenna elements occur in groups of three and that they be arranged symmetrically, and preferably arranged symmetrically with respect to both the "X" and "Y" axes. Further, in some embodiments the array elements will occur in multiples of 2 (e.g., 2, 4, 6, 8, etc.). Additionally, it is preferred that in some embodiments clusters of basic 6-turn elements should also be included in multiples of three (e.g., there are six such clusters in FIG. 6).

In certain embodiments, the groups of elements might be arranged at angles of 45°, 60°, 90°, 120°, etc., with respect to each other as is generally indicated generally in the figures. Other variations are within the teachings of the present invention.

Figure 12:
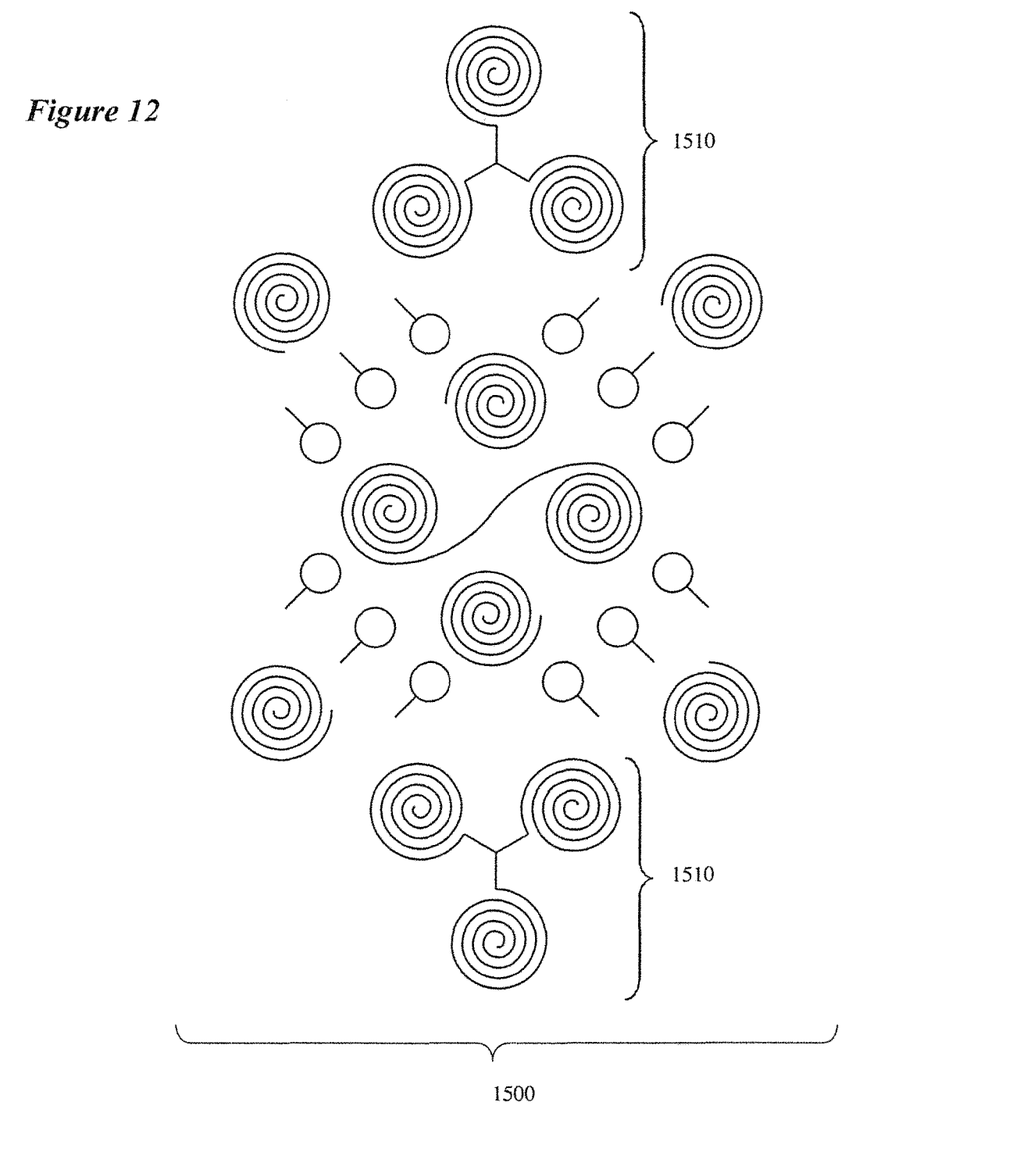
FIG. 12 contains an embodiment of a collection of antenna elements arranged as an array according to the teachings herein.

With respect to FIG. 12, this drawing illustrates how it might be possible to construct an array 1500 where the number of spirals is equal to a multiple of 2, i.e., in the embodiment of FIG. 12 fourteen spirals are used. It is preferred that in some embodiments there also be at least one group of three spirals (1510).

In some embodiments an antenna element will be made of copper or any other electrically conductive metallic, non-metallic, or organic, or nonorganic material (e.g., carbon, gold copper, silver, aluminum, etc.). In some embodiments it will act as a photonic or other transducer, converting low intensity EMF radiation into electrical or other energy.

Figure 9:
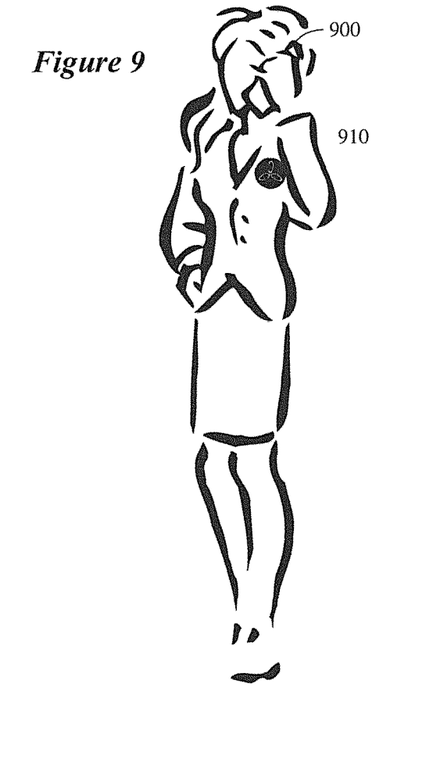
FIG. 9 contains a schematic illustration of an embodiment of an array according to the instant invention as it might be used in practice.

According to an embodiment, the instant invention is designed to mitigate the impact of low-intensity EMF radiation on an individual who wears or carries same in the presence of an EMF field, which may be referred to as biofield hereinafter. In FIG. 9, the biofield of the individual would be negatively impacted by EMF radiation from the cellular telephone absent the presence of an embodiment of the antenna 500 that has been situated on the individual's clothing. That being said, a cellular telephone is just one example of a source that continuously emits low level EMF radiation. As such, it should be noted that an embodiment of the instant array might be affixed to or made a part of a natural or manufactured emitting source (e.g., FIG. 5) or placed on the object that is to be protected (FIG. 13).

Turning again to FIG. 5, there is provided an example of how the instant invention might appear as implemented on a smart cellular phone. As is indicated, in one embodiment the algorithm will write a representation of a simulated array of the sort described above to the screen of the phone, thereby providing the user with the benefits of the instant invention during such time as that screen is displayed. In some embodiments the simulated array will be written as the background to the current display. In some cases, the array will be made only marginally visible (e.g., by making it translucent nearly transparent, low intensity, roughly matching the user's preferred background color, reducing it in size so that less than the entire screen is occupied, etc.) so that its presence will not be too distracting. Of course, those of ordinary skill in the art will be able to readily devise alternatives.

As has been noted previously, the icon 500 is intended to generically represent any combination of the spiral forms taught herein. Thus, its appearance in various of the figures herein should be broadly understood to be indicative of the presence of individual ones, or multiple ones, of the spirals and other shapes according to the rules of various embodiments described previously.

In another embodiment, though, it should be noted that if the screen is not accessible to the instant program because, for example, it is being used for some other purpose or the display is currently turned off, it would be possible to write this simulated array to volatile or nonvolatile memory in a location so as to achieve comparable results, even if the screen displays something different form that contained in FIG. 5.

Figure 10A:
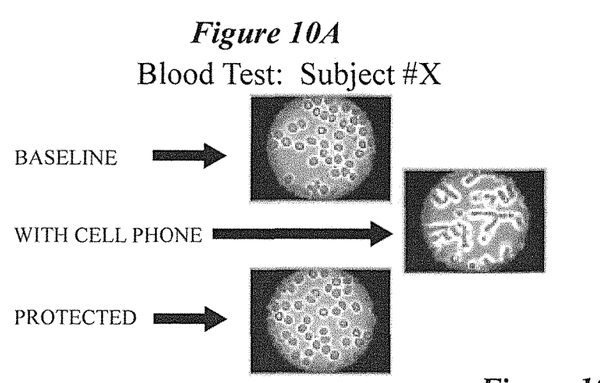
FIGS. 10A-10C illustrate actual photomicrographs of blood cells before and during exposure to EMF radiation, and with and without activation of an embodiment of the instant invention.
Figure 10B:
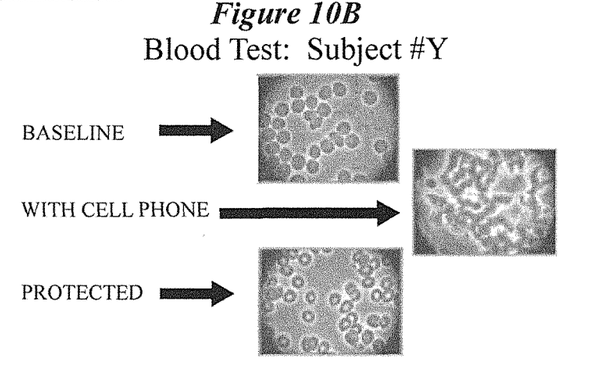
Figure 10C:
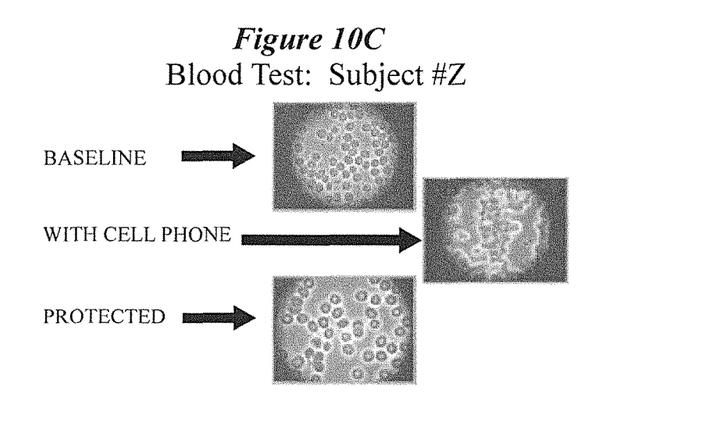

As partial substantiation to the claims here, attention is directed to FIGS. 10A through 10C which show the photo-micrographs of human blood during lab tests. In each case (i.e., for both Subjects X, Y, and Z) the top illustration in each figure shows red blood cells in advance of the subject being exposed to EMF radiation sourced by a cellular telephone. The second/right most image in each figure indicates what happens to red blood cells after a period of such exposure. Obviously, EMF radiation from the phone has had a dramatic impact on the appearance of the red bloods cells in these figures via interaction with them. Finally, the bottom image in each case contains a photomicrograph of red blood cells that were collected from the same subjects after EMF radiation via cellphone, where the phone was executing an embodiment of the instant invention during the exposure as is discussed more fully below. As can be seen, the red blood cells have returned to near normal/baseline values due to the intervention of the instant invention.

Figure 11:
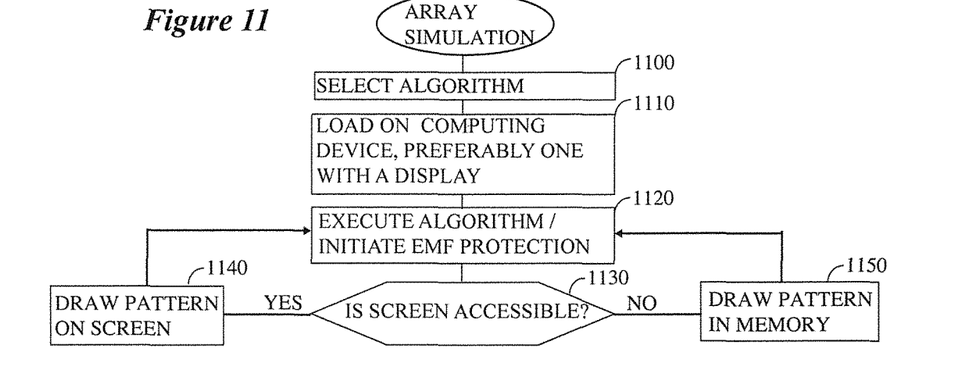
FIG. 11 indicates an operating logic suitable for use with the instant invention.

Turning to FIG. 11, this figure contains an operating logic suitable for use with an embodiment of the instant invention. In one embodiment and according to this figure, an algorithm will be selected (1100) and loaded (1110) onto the computing device of choice. The algorithms referred to would include, for example, execution of one or more of the equations presented above to create some number of the elements 10 in connection with formation of a pattern such as those illustrated in FIGS. 1-3, and drawing the resulting image (e.g., in the form of FIGS. 6-8) in connection with the hardware embodiment.

Next, and preferably, the selected algorithm will be executed 1120 by the CPU(s) of the device on which the algorithms were loaded. Preferably, this device will have a display screen, but it could be that such is not available, in which case the logic discussed below will handle that condition.

Next, in an embodiment, a determination will be made as to whether or not the screen is accessible (step 1130). If the answer is "YES" (the left branch of decision item 1130), the simulated array will be drawn on that screen and the algorithm will branch to step 1130 for further processing. According to some embodiments, the application might write to the display a low or very low contrast (e.g., translucent or semi-translucent) version of the pattern in such a way that it will overlaying the contents of the current screen display but not substantially interfere with it.

On the other hand, if the screen is not available (e.g., it is being used for other purposes or the device on which the algorithm is executing has no such display, for example a WiFi router, radio receiver/transmitter), the instant invention will execute the selected algorithm (from step 1100) and write the simulated array into memory 1150. After that is done, the instant invention will return to step 1120 for further processing.

An experiment was conducted to test the efficacy of the instant invention as applied to a EMF radiation emitted from a cellular telephone. Twenty pre-screened male subjects were used, where the prescreening eliminated subjects with indicators for increased DNA damage (e.g., drug use, tobacco use, radiation exposure, etc.). A standard Samsung Galaxy Note 4 cellular phone was acquired and preloaded with (a) an Android cell phone application that functioned according to the instant invention; and, (b) with an audio book in the form of an mp3 file (30 minutes in length) which each subject was instructed to listen to when instructed to do so. With respect to (a), the program was designed to write a plurality of the virtually transparent array elements of the sort described above to the background display of the cell phone.

As an initial matter and prior to using the phone to listen to the audio book, five to ten hairs were plucked from the head of each subject from a location on the subject's head close to the location where the base of the phone antenna would be during a normal phone conversation. The side of the subject's head (left or right) from which the hair was obtained was the side that was customarily used when speaking on the phone. Each of the subjects was then instructed to listen to the entirety of the audio recording as though that individual was listening to a phone conversation, i.e., with the speaker of the phone proximate to the subject's ear. Ten subjects listened to the phone without activating the embodiment of the software invention and the other ten subjects used the same phone with the protection embodiment enabled. Immediately after the audio recording ended, five to ten hairs were again plucked from the same location on that subject's head.

Laboratory Method:

Turning next to the method of analysis, the hairs were immersed in a 1.5 mL microfuge tube that contained 750 μL of RPMI 1640 media without serum. The microfuge tube was put on ice for 30 min to prevent any DNA damage or repair in hair follicle cells and to maintain consistent electrophoresis conditions for all samples. Afterwards, the hairs were transferred to a 1.5 mL microfuge tube that contained 750 μL of collagenase (1 mg/mL) to dissociate the hair cells from the hair follicle. They were then incubated for 15 min at 37° C. with 5% $CO_2$ in air and 100% humidity. During the 15 min incubation, the tube was vortexed at the 5 and 10 min time points for more efficient action of the collagenase.

After the incubation, 750 μL of RPMI 1640 medium with 10% Fetal Bovine Serum was added to the tubes to inactivate the collagenase. Then hairs were taken out. The microfuge tube was then centrifuged for 5 min at 5000 g. The supernatant was discarded and the cell pellet was re-suspended in 10 μL of medium. DNA damage in hair follicle cells was assayed by the Comet Assay.

Microgels were prepared on custom-made MGE slides. These slides provide a clear, non-frosted area in the center (1×3 cm) for low background visualization of DNA and a frosted area around for firm attachment of agarose. The first layer of microgel was made by putting 100 μl of 0.5%, 1:3 high-resolution agarose in the center of a slide and covering by a 24×50 mm cover glass. After cooling the slide for 1 minute on an ice cold steel tray, the cover glass was removed and the microgel was allowed to air dry at room temperature. On top of the dried layer the first wet layer was made, 250 μl of 0.7%, 1:3 high-resolution agarose was used to make microgel. Ten μl of the suspension of hair follicle cells were mixed well with 50 microliters of 0.7%, 1:3 high-resolution agarose. Fifty microliters of this mixture was layered onto the pre-coated slide to make a second layer of microgel. After removing the cover-glass, another layer of 250 □l of 0.7% agarose was layered on top of the cell layer and covered again with a cover-glass.

After removing the cover glass, the slides were incubated for 1 h in a lysing solution (pre-warmed to 37° C.) composed of 1.25 M NaCl, 0.01% sodium lauryl sarcosine, 50 mM tetra sodium EDTA, 10 mM tris, at pH 10. Freshly prepared reduced glutathione (1 mg/mL) and proteinase K (0.5 mg/mL) were then added. They were then placed on a horizontal electrophoretic unit modified to allow electrical input from power supply to both ends of a positive and negative electrode. The unit was filled with a liter of a solution containing 300 mM sodium hydroxide, 1 mM EDTA, and 0.2% DMSO. After 20 min of DNA unwinding and equilibrium of the microgel in the solution, electrophoresis (18 volts, 480 mA) and solution recirculation (100 ml/min) was started simultaneously for 20 min. Slides were then immersed in a neutralizing/DNA precipitating solution of Cetyl trimethylammonium bromide (CTAB) for 10 min and this step was repeated once more and the slides were immersed in 75% Tris-ethanol for 10 min. This step was repeated twice more at room temperature. Slides were then air-dried overnight.

One hundred microliters of YOYO stain were applied in two rows of 10 small, equally spaced droplets over the clear window area of a slide and spread using a pipette tip without touching the slide. The slide was then covered with a cover glass.

Soon after staining, the slide was analyzed using a fluorescent microscope and the image-analysis software "Vis-Comet". One hundred cells from each sample were analyzed and several parameters were measured as indices of DNA strand breaks: comet extent, percent DNA in tail, tail moment, and tail integrated intensity.

Averages of the data from the 100 cells from each slide were calculated for each parameter and used in data analysis. Changes in DNA damage before and after the cellular phone use were compared using the paired t-test. A difference at $p<0.05$ was considered statistically significant.

Results:

Table 1 shows levels of DNA damage in both groups before and after cellular phone usage, as measured by the parameter "Comet Extent", which is a quantitative measure of DNA damage. Larger values of that parameter are generally recognized as being indicative of greater amount of DNA damage. Those of ordinary skill in the art will recognize that comet assay measures double strand breaks, single strand breaks, oxidative BNA base damage, etc., of the sort that could be caused by low level EMF radiation emitted by a cellular telephone when it was held in close proximity to the user's head. As such, the values of this test would be expected to reveal whether or not an embodiment provided an individual some protection against such damage from a cell phone.

Individual means, group means and standard error of mean were calculated for test described above for both groups. By way of summary, as is indicated by the tables below in this embodiment the data showed that 30 min of cellular phone use significantly increased DNA single strand breaks in hair follicle cells.

Tables 1a and 1b. Comet Extent (Show Average from 100 Cells from Each Subject Before and after Cell Phone Use)

TABLE 1a

| Exposure Group (Protection app disabled) | | |
|---|---|---|
| Subject | Before | After |
| 1 | 454 | 503 |
| 6 | 481 | 613 |
| 7 | 485 | 514 |
| 9 | 485 | 579 |
| 11 | 463 | 646 |
| 12 | 442 | 516 |
| 14 | 474 | 533 |
| 16 | 381 | 504 |
| 18 | 434 | 519 |
| 19 | 426 | 543 |
| Mean ± SEM | 452 ± 8 | 547 ± 9 |

Statistical analysis: $t=6.531$, $df=9$, $p<0.001$, i.e., cell phone use without protective algorithm significantly increased DNA damage.

Figure 15:
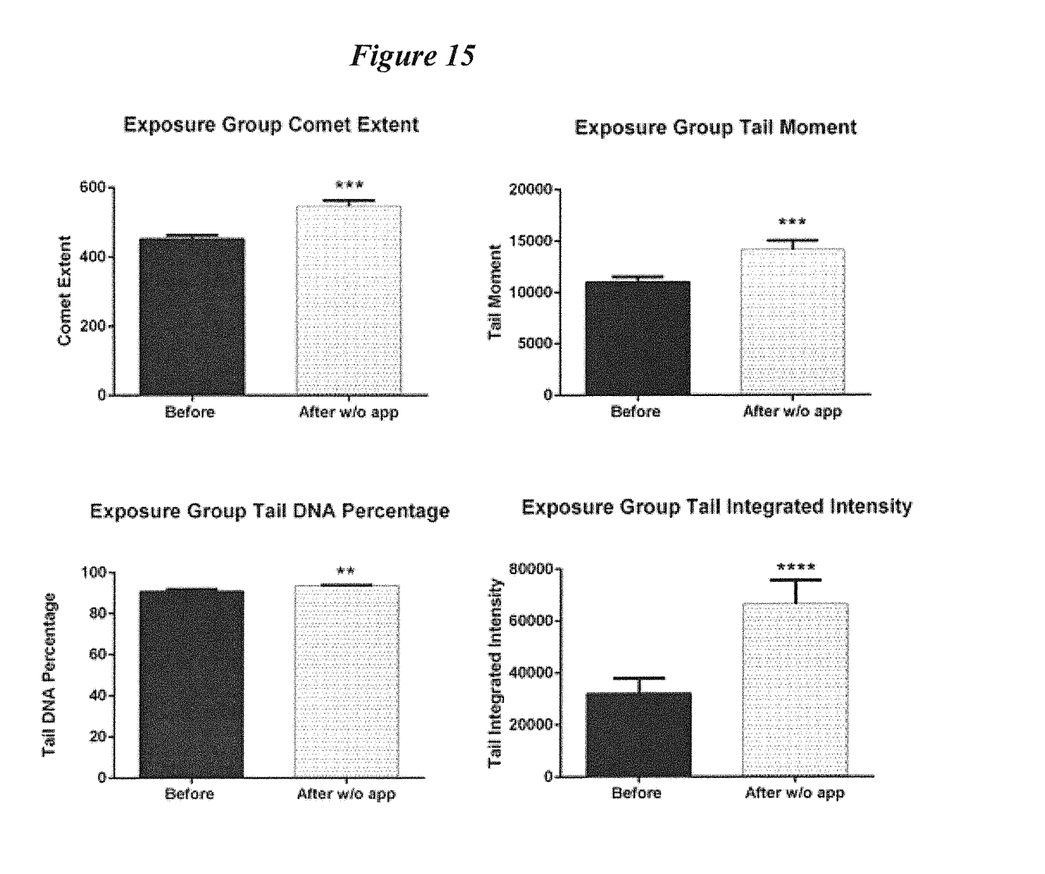
FIG. 15 contains illustrations of differences in DNA damage levels before and after cell phone use in exposed group (protection application disabled).  $p<0.01$; * $p<0.001$; **** $p<0.0001$ for an embodiment.
Figure 16:
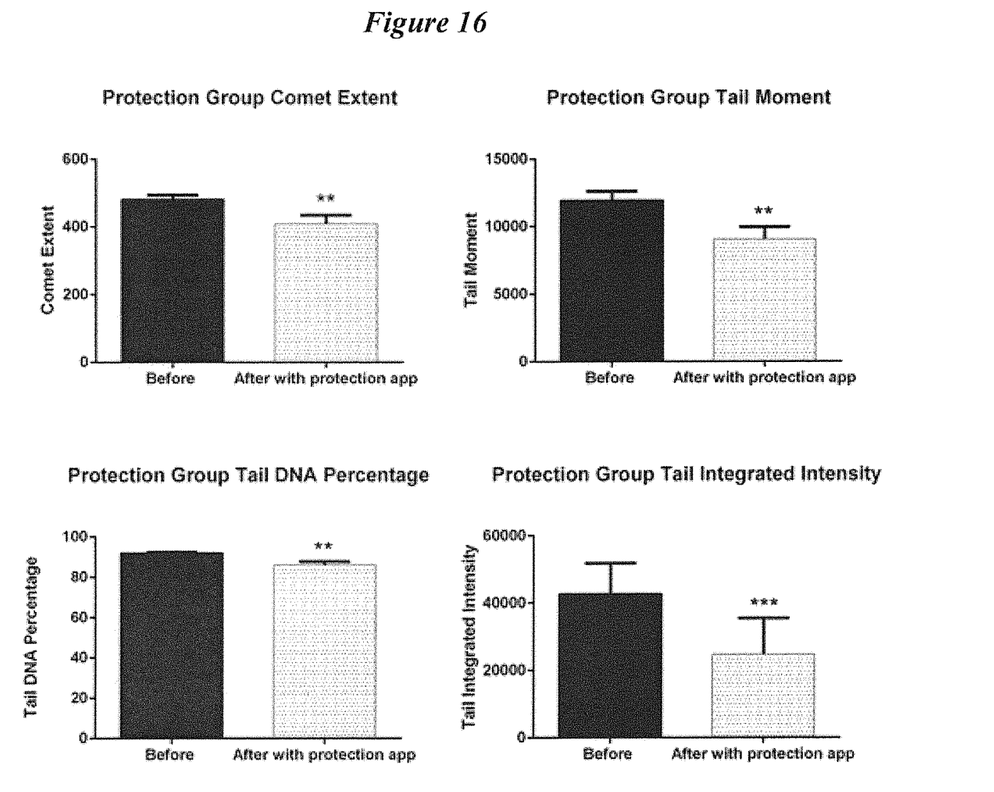
FIG. 16 contains illustrations of the differences in DNA damage levels before and after cell phone use in protected group (protection application enabled).  $p<0.01$; * $p<0.001$.

On the other hand, after a software embodiment of the invention was activated, the previously seen increase in DNA breakage was blocked, and there was actually a slightly significant decrease in DNA breaks in hair follicle cells tested. Data of other strand break parameters are shown in FIGS. 15 and 16.

TABLE 1b

| Protected Group (Protection app enabled) | | |
|---|---|---|
| Subject | Before | After |
| 2 | 504 | 381 |
| 3 | 486 | 503 |
| 4 | 544 | 547 |
| 5 | 504 | 369 |
| 8 | 520 | 507 |
| 10 | 483 | 342 |
| 13 | 393 | 335 |
| 15 | 446 | 346 |
| 17 | 448 | 359 |
| 20 | 476 | 410 |
| Mean ± SEM | 480 ± 3 | 410 ± 4 |

Statistical analysis: $t=3.875$, $df=9$, $p<0.01$, i.e., cell phone use with protective algorithm significantly decreased DNA damage.

In summary, exposure to cellular phone radiation increased DNA damage in human hair follicle cells (Table 1a). Use of an embodiment according to the invention during cell phone operation attenuated the DNA-damaging effects of the radiation (Table 1 b). There was a significant difference observed between DNA damage levels measured before and after cellular phone usage in the exposed/without protection group (in all parameters). In the exposed group, which had the protection application disabled, DNA damage levels were significantly higher after 30 minutes of cellular phone usage. In contrast, the group with protection application enabled showed no increase in DNA damage levels after 30 min of cellular phone usage. In fact, these results show an interesting phenomenon. The DNA damage levels of subjects in the protected group had a small but significant decrease in DNA damage after their 30 minutes of cellular phone usage while an embodiment was active.

Finally, it should be noted that the instant invention might be implemented on or within, or attached or made proximate to any conventional or unconventional computing (programmable) device such as, by way of example and without limitation, a desk top computer, a cell phone, a lap top, a table top computer, a car video display, a medical workstation, medical diagnostic equipment, a home television, an MP3 player, Google® Glasses, or any other device that has a display screen (e.g., a refrigerator, a game controller, a treadmills, an automobile console, a cash register, a slot machine, etc.). Preferably, the device on which the instant invention will be implemented will have a display device or screen of some sort, although that is not a requirement as described supra.

The substrate 12 could potentially comprise any nonconductive material including, without limitation, plastic, cellulose pulps, metals, textiles, fabrics, polymers, ceramics, organic fibers, silicon, and composites, as specific examples. In particular, the substrate may be incorporated into and/or include a portion of an article of clothing or garment.

While this invention has been described with reference to illustrative embodiments, this description is not intended to be construed in a limiting sense. Various modifications and combinations of the illustrative embodiments as well as other embodiments of the invention, will be apparent to persons skilled in the art upon reference to the description.

It is, therefore, intended that the appended claims encompass any such modifications or embodiments.

Note that when the terms "computer", "computing device", "CPUs", etc., are used herein these terms should be broadly interpreted to include any programmable device whether a consumer electronics product (e.g., personal computer, smart phone, tablet, etc.) or an electronic appliance or other device that has a programmable chip (e.g., microprocessor, micro controller, etc.) integral thereto.

Figure 14:
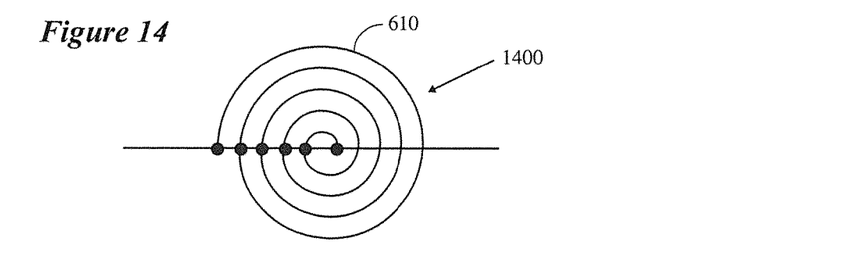
FIG. 14 contains a schematic illustration of how turns are calculated according to an embodiment.

Further, it should be noted that when the term "spiral array element" or "spiral" is used herein, unless specifically indicated to the contrary that should be interpreted to require a non-logarithmically expanding spiral form that has at least three turns, but preferably six "turns". FIG. 14 contains an illustration of how "turns" are determined according to the instant disclosure. In that figure, a line has been drawing between the starting and ending points of the spiral 1400. Each dot in that figure represents a "one turn" and, as it indicated in this drawing, counting both the starting and ending points there are six turns in the spiral 1400.

Thus, the present invention is well adapted to carry out the objects and attain the ends and advantages mentioned above as well as those inherent therein. While presently preferred embodiments have been described for purposes of this disclosure, numerous changes and modifications will be apparent to those skilled in the art. Such changes and modifications are encompassed within the spirit of this invention as defined by the appended claims.

What is claimed is:

1. An antenna array comprising:
   a. a substrate; and,
   b. three or more conductive spiral array elements symmetrically arrayed and present on said substrate, each of said three or more array elements having a form defined by the equation in the polar coordinates as $r^2 = a^2\theta$, where r is a distance from an origin and $\theta$ is an angle of rotation chosen such that each of said spiral array elements has at least six turns, and a is an arbitrary constant, and, wherein a number of said three or more array elements is a multiple of either two or three.

2. The antenna array according to claim 1, wherein each of said array elements is comprised of a material selected from the group consisting of gold, silver, copper, aluminum, and carbon.

3. The antenna array according to claim 1, wherein said substrate is made of a material selected from the group consisting of plastic, cellulose pulps, textiles, fabrics, polymers, ceramics, organic fibers, silicon, and composites.

4. An antenna array comprising:
   a. a substrate; and,
   b. three conductive spiral array elements symmetrically arrayed around a central point and present on said substrate, each of said three array elements having a terminus, said three termini of each of said three array elements meeting at said central point, each of said array elements being defined by the equation in the polar coordinates as $r^2 = a^2\theta$, where r is a distance from an origin and $\theta$ is an angle of rotation chosen such that each of said spiral array elements has at least six turns, and a is an arbitrary constant, and, wherein a number of said three or more array elements is a multiple of either two or three.

\* \* \* \* \*